(12) United States Patent
Shibata

(10) Patent No.: US 11,672,109 B2
(45) Date of Patent: Jun. 6, 2023

(54) COMPONENT EVALUATION METHOD, ELECTRICAL CHARACTERISTIC MEASUREMENT METHOD, COMPONENT PACKAGING MACHINE, AND MACHINE DEDICATED TO ELECTRICAL CHARACTERISTIC MEASUREMENT

(71) Applicant: FUJI CORPORATION, Chiryu (JP)

(72) Inventor: Mitsuhiko Shibata, Toyota (JP)

(73) Assignee: FUJI CORPORATION, Chiryu (JP)

( * ) Notice: Subject to any disclaimer, the term of this patent is extended or adjusted under 35 U.S.C. 154(b) by 602 days.

(21) Appl. No.: 16/334,518

(22) PCT Filed: Sep. 20, 2016

(86) PCT No.: PCT/JP2016/077625
§ 371 (c)(1),
(2) Date: Mar. 19, 2019

(87) PCT Pub. No.: WO2018/055658
PCT Pub. Date: Mar. 29, 2018

(65) Prior Publication Data
US 2020/0084929 A1 Mar. 12, 2020

(51) Int. Cl.
*H05K 13/08* (2006.01)
*H05K 13/04* (2006.01)
*H05K 13/00* (2006.01)

(52) U.S. Cl.
CPC ....... *H05K 13/082* (2018.08); *H05K 13/0069* (2013.01); *H05K 13/0409* (2018.08); *H05K 13/0419* (2018.08); *H05K 13/0882* (2018.08)

(58) Field of Classification Search
CPC ............. H05K 13/082; H05K 13/0409; H05K 13/0419; H05K 13/0882; H05K 13/0069;
(Continued)

(56) References Cited

U.S. PATENT DOCUMENTS

2003/0072644 A1* 4/2003 Yamamura ......... H05K 13/0419
414/749.1
2004/0073322 A1* 4/2004 Maenishi ............. H05K 13/085
700/28
(Continued)

FOREIGN PATENT DOCUMENTS

JP 63-232168 A 9/1988
JP 64-76100 A 3/1989
(Continued)

OTHER PUBLICATIONS

International Search Report dated Dec. 13, 2016 in PCT/JP2016/077625 filed on Sep. 20, 2016.

*Primary Examiner* — Peter Dungba Vo
*Assistant Examiner* — Azm A Parvez
(74) *Attorney, Agent, or Firm* — Oblon, McClelland, Maier & Neustadt, L.L.P.

(57) ABSTRACT

Based on the measured values of the electrical characteristics of multiple components including a component positioned in the middle among many components held on the component tape, it is possible to more accurately estimate the electrical characteristics of the many components as compared with the case based on the measured value of the electrical characteristic of a component positioned at the leading end. Also, based on the statistically processed results of these measurement values, it is possible to appropriately evaluate the electrical characteristics of many components. Further, if the electrical characteristics of all of the components are measured, the evaluation can be performed more appropriately.

7 Claims, 13 Drawing Sheets

(58) Field of Classification Search
CPC ........... Y10T 29/53174; Y10T 29/5313; Y10T 29/53; Y10T 29/53178
USPC .................................. 29/739, 729, 700, 740
See application file for complete search history.

(56) References Cited

U.S. PATENT DOCUMENTS

2014/0077793 A1    3/2014  Arai
2016/0150687 A1*   5/2016  Shibata ................ G05B 19/418
                                                            700/121

FOREIGN PATENT DOCUMENTS

| JP | 2001-332900 A | 11/2001 | |
|----|---------------|---------|---|
| JP | 2007-335609 A | 12/2007 | |
| JP | 2013-84641 A | 5/2013 | |
| JP | 2013084641 A * | 5/2013 | |
| WO | WO 2013/186861 A1 | 12/2013 | |
| WO | WO-2013186861 A1 * | 12/2013 | ......... H05K 13/0417 |

* cited by examiner (a)

REEL A(IDa)

| | | | | |
|---|---|---|---|---|
| C*=1 | A | PLACEMENT (x0,y0) | ADD | |
| C*=2 | A | MOUNTING (x,y) | n=1 | |
| | B | MOUNTING (x,y) | n=2 | |
| | C | MOUNTING (x,y) | n=3 | |
| C*=3 | A | MOUNTING (x,y) | n=4 | |
| | C | MOUNTING (x,y) | n=5 | |
| | C | MOUNTING (x,y) | n=6 | |
| | B | MOUNTING (x,y) | n=7 | |
| | B | MOUNTING (x,y) | n=8 | |
| | C | MOUNTING (x,y) | n=9 | |
| | ⋮ | ⋮ | | |
| | B | MOUNTING (x,y) | n=MA×i+1 | |
| | B | MOUNTING (x,y) | n=MA×i+2 | |
| C*=NA | A | MOUNTING (x,y) | n=MA×i+3 | UNMEASURED FLAG ON |
| | C | MOUNTING (x,y) | n=MA×i+4 | |
| C*=NA+1 | A | MOUNTING (x,y) | n=MA×i+5 | |
| | B | MOUNTING (x,y) | n=MA×i+6 | |
| | C | MOUNTING (x,y) | n=MA×i+7 | |
| | C | MOUNTING (x,y) | n=MA×i+8 | |
| C*=NA+2 | A | PLACEMENT (x0,y0) | ADD | UNMEASURED FLAG OFF |
| | B | MOUNTING (x,y) | | |
| | B | MOUNTING (x,y) | | |
| | C | MOUNTING (x,y) | | |
| C*=NA+3 | A | MOUNTING (x,y) | | |
| | C | MOUNTING (x,y) | | |
| | ⋮ | ⋮ | | |

COMPONENT EVALUATION METHOD, ELECTRICAL CHARACTERISTIC MEASUREMENT METHOD, COMPONENT PACKAGING MACHINE, AND MACHINE DEDICATED TO ELECTRICAL CHARACTERISTIC MEASUREMENT

TECHNICAL FIELD

The present application relates to the electrical characteristic of a component held on a component tape.

BACKGROUND ART

The component evaluation method described in Patent Literature 1 is a method of evaluating the dimensional accuracy of a component held on a component tape, and in this component evaluation method, when a component supplied by the component tape is picked up, conveyed, and mounted on a circuit board with a suction nozzle, each component held with the suction nozzle is imaged with a camera, and the dimensions of each component are obtained based on the captured image. The data representing the obtained dimensions are then statistically processed and evaluated. In the component evaluation method described in Patent Literature 2, when mounting of a component is started, the electrical characteristic of a component disposed at the leading end of many components held side by side in the longitudinal direction on a component tape is measured, and based on the measured value, it is evaluated whether the electrical characteristics of the many components held on the component tape are appropriate.

PATENT LITERATURE

Patent Literature 1: JP-A-2007-335609
Patent Literature 2: JP-A(U)-Hei1-76100

BRIEF SUMMARY

Technical Problem

An object of the present disclosure is to make it possible to appropriately evaluate the electrical characteristics of many components held on a component tape.

Solution to Problem

In the component evaluation method according to the present disclosure, electrical characteristics of multiple components including components disposed in the middle among many components held on a component tape are measured, and the measured values are statistically processed.

In this manner, based on the measured values of the electrical characteristics of the multiple components including the components disposed in the middle among the many components held on the component tape, it is possible to more accurately estimate the electrical characteristics of the many components as compared with the case merely based on the measured value of the electrical characteristic of a component disposed at the leading end, and it is further possible to appropriately evaluate the electrical characteristics of the many components based on the result statistically processed by these measured values. Further, when the electrical characteristics of all of the many components are measured, the evaluation can be performed even more appropriately.

"Components disposed in the middle" refer to components, among many components held on a new component tape, excluding the component at the leading end and a component at the tail (meaning the upstream end), and can be, for example, (1) components positioned for every number of a predetermined set number, (2) components corresponding to numerical values determined based on random numbers when the whole numerical values are sequentially numbered to the components arranged in the longitudinal direction, (3) components selected from each of multiple groups, each consisting of a set number of components. The "multiple components including components disposed in the middle" may include components disposed at least one of the leading end (meaning the downstream end) and the tail.

Further, the electrical characteristic of the component disposed in the middle of the component tape can be measured in the mounting work of a component. "In the mounting work" means "after the start, before the completion, and during the mounting work" and, for example, the electrical characteristic of a component can be measured "by stopping the mounting work" or "in parallel with the mounting work". Note that a component whose electrical characteristic is measured may be mounted on a circuit board or may be discarded after the measurement.

BRIEF DESCRIPTION OF DRAWINGS

FIG. 18 is a diagram conceptually showing an example of a mounting and placing sequence generated by executing the program.

DETAILED DESCRIPTION

Hereinafter, a component mounting system will be described in detail with reference to the drawings. In the component mounting system, a component evaluation method and an electrical characteristic measurement method according to the present disclosure are implemented. The component mounting system includes multiple component mounting machines according to the present disclosure.

First Embodiment

Figure 1:
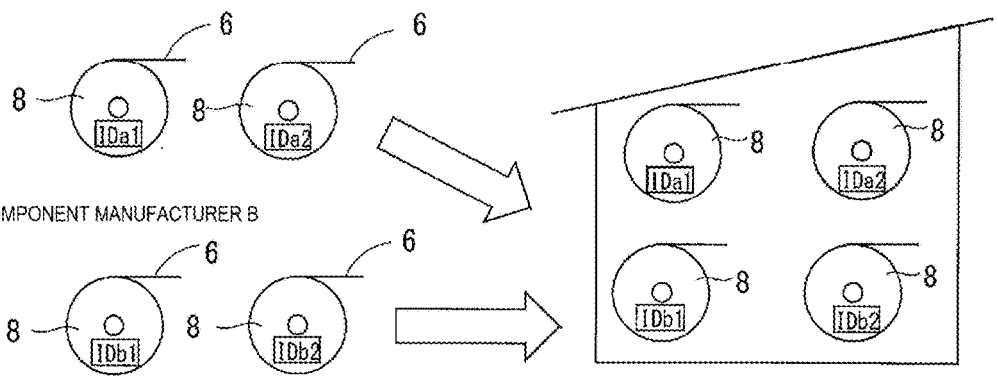
FIG. 1 is a diagram conceptually showing a component mounting system capable of implementing a method according to a first embodiment of the present disclosure. The component mounting system includes a component mounting machine.
Figure 1:
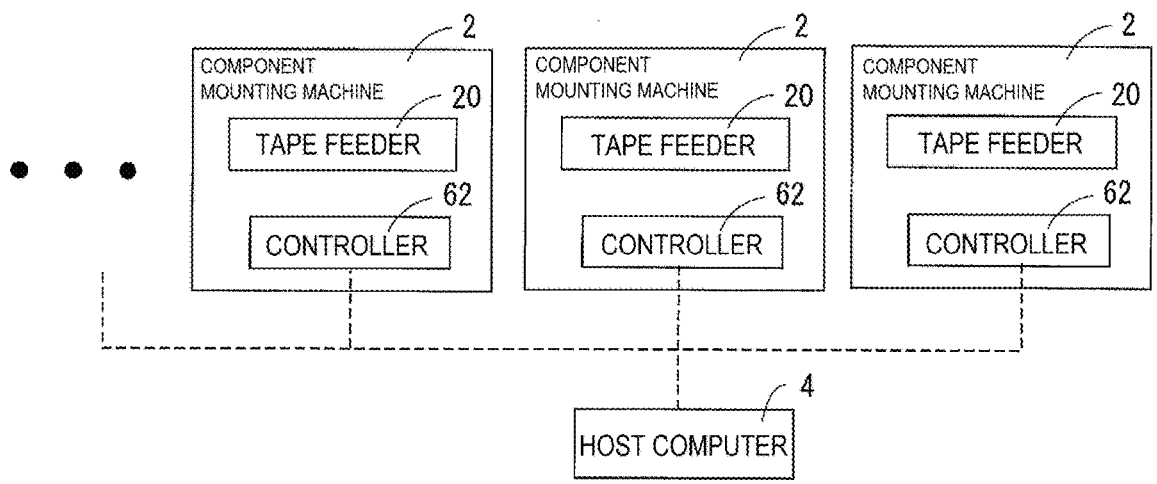

As shown in FIG. 1, the component mounting system includes multiple component mounting machines 2 and host computer 4 as an external computer connected to multiple component mounting machines 2. In each of multiple component mounting machines 2, when a mounting work of mounting an electronic component (hereinafter simply referred to as a component) on a circuit board (hereinafter abbreviated as a board) is performed, reel 8 on which component tape 6 for holding the component is wound is used. Reels 8 are managed by identification information IDs (hereinafter simply referred to as IDs or abbreviated as reel IDs) individually assigned to respective reels 8. Reels 8 are stored in a depository after being purchased from a component manufacturer, and at this time, the reel ID is read and stored in the memory section of host computer 4. The reel ID includes information indicating a component manufacturer, a type of a component, a standard value of an electrical characteristic, a tolerance (difference between an allowable maximum value and an allowable minimum value), the number of components, a lot number, and the like.

In each of component mounting machines 2, typically, reels 8 are taken out of the depository prior to the start of the mounting work and used, and returned into the warehouse after the completion of the mounting work. Therefore, in multiple component mounting machines 2 having the common depository, reels 8 of the same ID or reels 8 purchased from the same component manufacturer may be used. From the above, it is desirable that multiple component mounting machines 2 connected to host computer 4 have the same supplier (at least one of the component manufacturer or the depository) of reels 8 to be used, regardless of the installation location. This is because host computer 4 can efficiently aggregate information on the same reel 8 used in multiple component mounting machines 2 and reels 8 of the same component manufacturer. In some cases, reel 8 refers to the one before component tape 6 is wound thereon, while in the present embodiment, refers to the one on which component tape 6 is wound.

Figure 2:
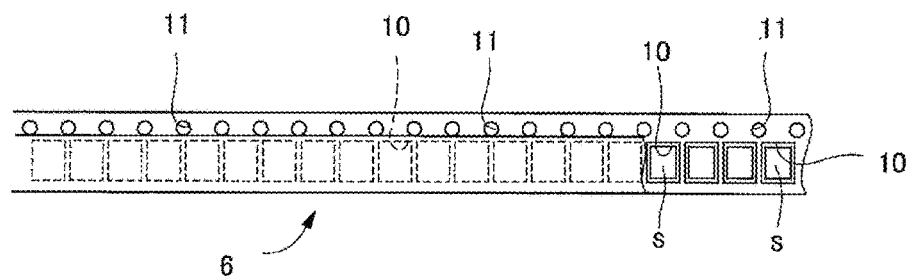
FIG. 2 is a plan view of a component tape wound on a reel attachable to the component mounting machine.

As shown in FIG. 2, component tape 6 accommodates and holds component s in each of many concave portions 10 formed in the central portion in a line in the longitudinal direction. Further, many feeding holes 11 are formed in the side portion of component tape 6 side by side in the longitudinal direction.

Figure 3:
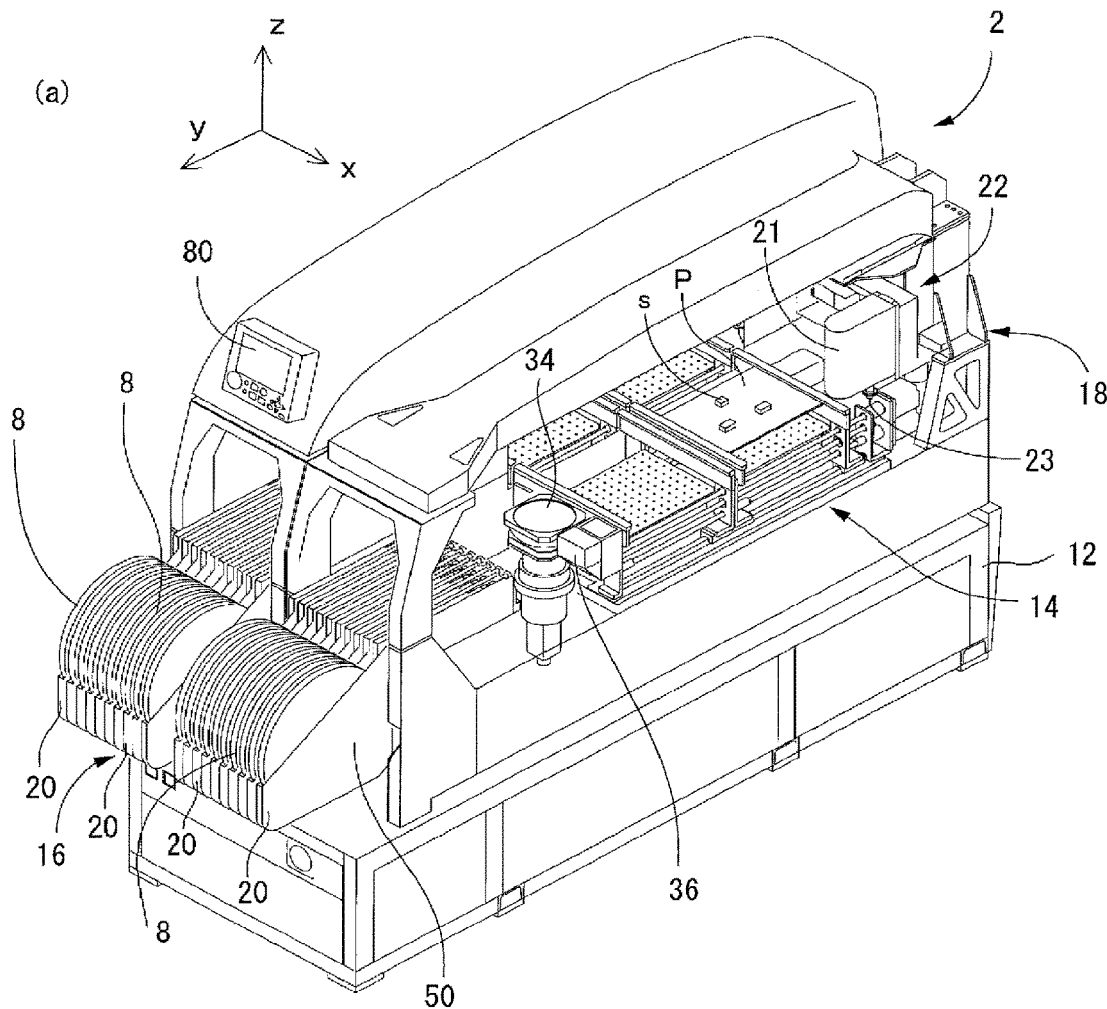
FIG. 3(a) is a perspective view of the component mounting machine.
FIG. 3(b) is a perspective view of a head attachable to the component mounting machine.
Figure 3:
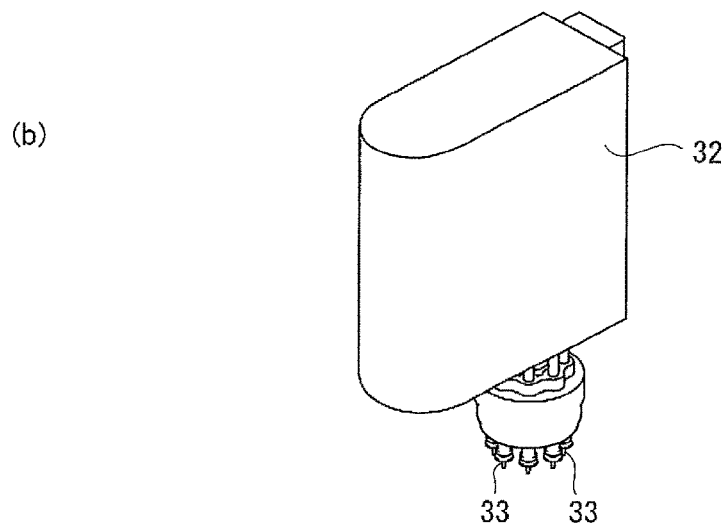

As shown in FIG. 3(a), component mounting machine 2 mounts components s on board P, and includes main body 12, circuit board conveyance and holding device 14, component supply device 16, head device 18, and the like.

Circuit board conveyance and holding device 14 conveys and holds board P, and the conveyance direction, the width direction, and the thickness direction of board P are referred to as the x direction, the y direction, and the z direction, respectively. The y direction and the z direction are the front-rear direction and the up-down direction of component mounting machine 2, respectively. Component supply device 16 supplies components s to be mounted on board P, and includes multiple tape feeders 20 and the like. Each of multiple tape feeders 20 includes reel holding section 50, a feeding device (not-shown), and the like, and the feeding device feeds component tape 6, which is wound on reel 8 held by reel holding section 50, on a pitch-by-pitch basis using feeding holes 11.

Figure 4:
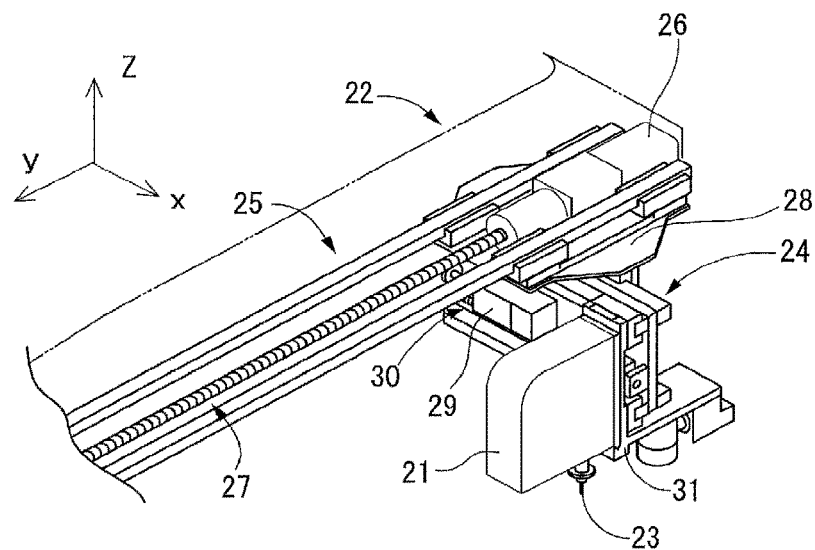
FIG. 4 is a perspective view of a head moving device of the component mounting machine.

Head device 18 includes head 21 and head moving device 22 for moving head 21 in the x and y directions. Head 21 is a single head which holds one suction nozzle 23 for holding component s so as to be able to move the nozzle up and down. As shown in FIG. 4, head moving device 22 includes x moving device 24 and y moving device 25. Y moving device 25 moves y slider 28 in the y direction via motion conversion mechanism 27 by driving y motor 26, and x moving device 24 is provided on y slider 28 and moves x slider 31 in the x direction via motion conversion mechanism 30 by driving x motor 29. Although head 21 is detachably attached to x slider 31, this head can be exchanged with head 32 shown in FIG. 3(b). Head 32 is a multi-head which holds multiple (MA) suction nozzles 33 so as to be able to rotate intermittently and move up and down.

Figure 5:
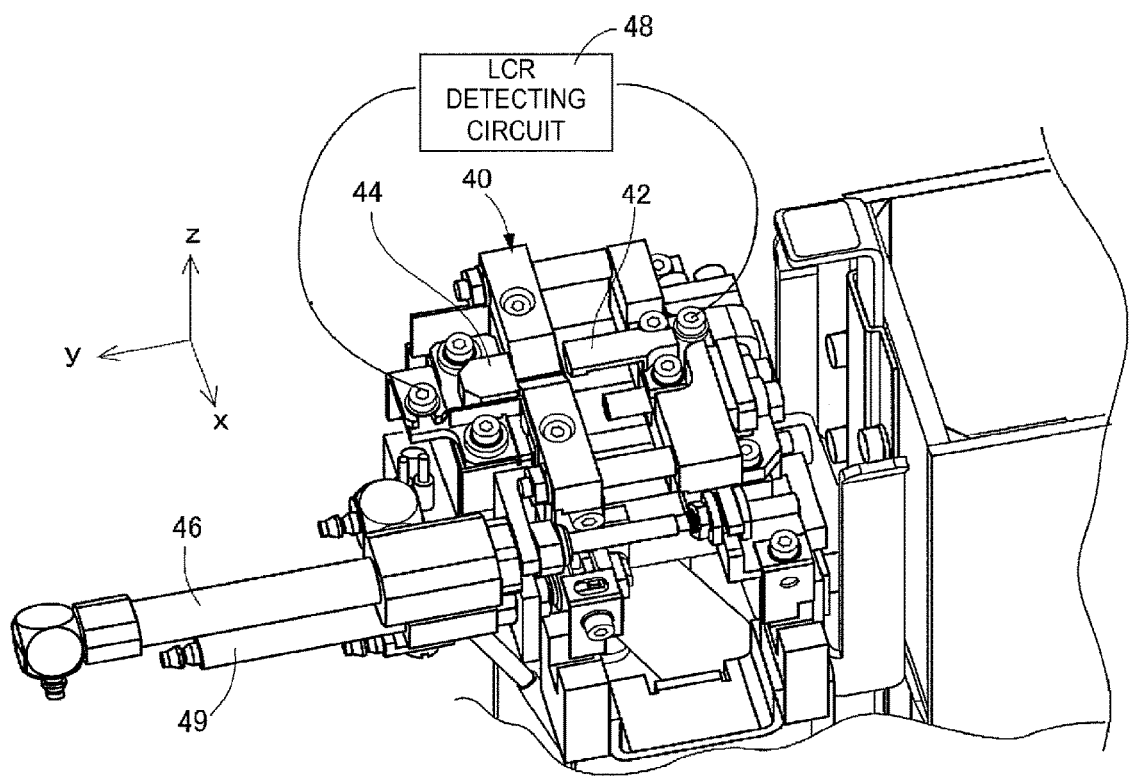
FIG. 5 is a perspective view of an electrical characteristic measurement device provided in the component mounting machine.

Reference numeral 34 denotes a camera for imaging component s held with suction nozzle 23, and reference numeral 36 denotes an LCR measurement device as an electrical characteristic measurement device for measuring the electrical characteristic of a corner chip as component s. LCR measurement device 36 measures L (inductance), C (capacitance), R (resistance), Z (impedance) or the like as the electrical characteristic of component s, and is attached to the main body of circuit board conveyance and holding device 14 inside component mounting machine 2 in this embodiment. As shown in FIG. 5, LCR measurement device 36 includes (a) component holding table 40, (b) a pair of measurement parts 42, 44, (c) approaching and separating device 46 that approaches or separates pair of measurement parts 42, 44 to or from each other by the operation of an air cylinder, (d) holding table moving device 49 that moves component holding table 40 to an initial position and a measurement position by the operation of an air cylinder, (e) LCR detecting circuit 48, and the like. The operation of the air cylinder is controlled by an electromagnetic valve (not shown) provided between an air source, the atmosphere, and the air chamber of the air cylinder. Hereinafter, in the present description, an electrical characteristic is sometimes referred to as LCR, and the measured value of the electrical characteristic is sometimes referred to as an LCR value.

Figure 6:
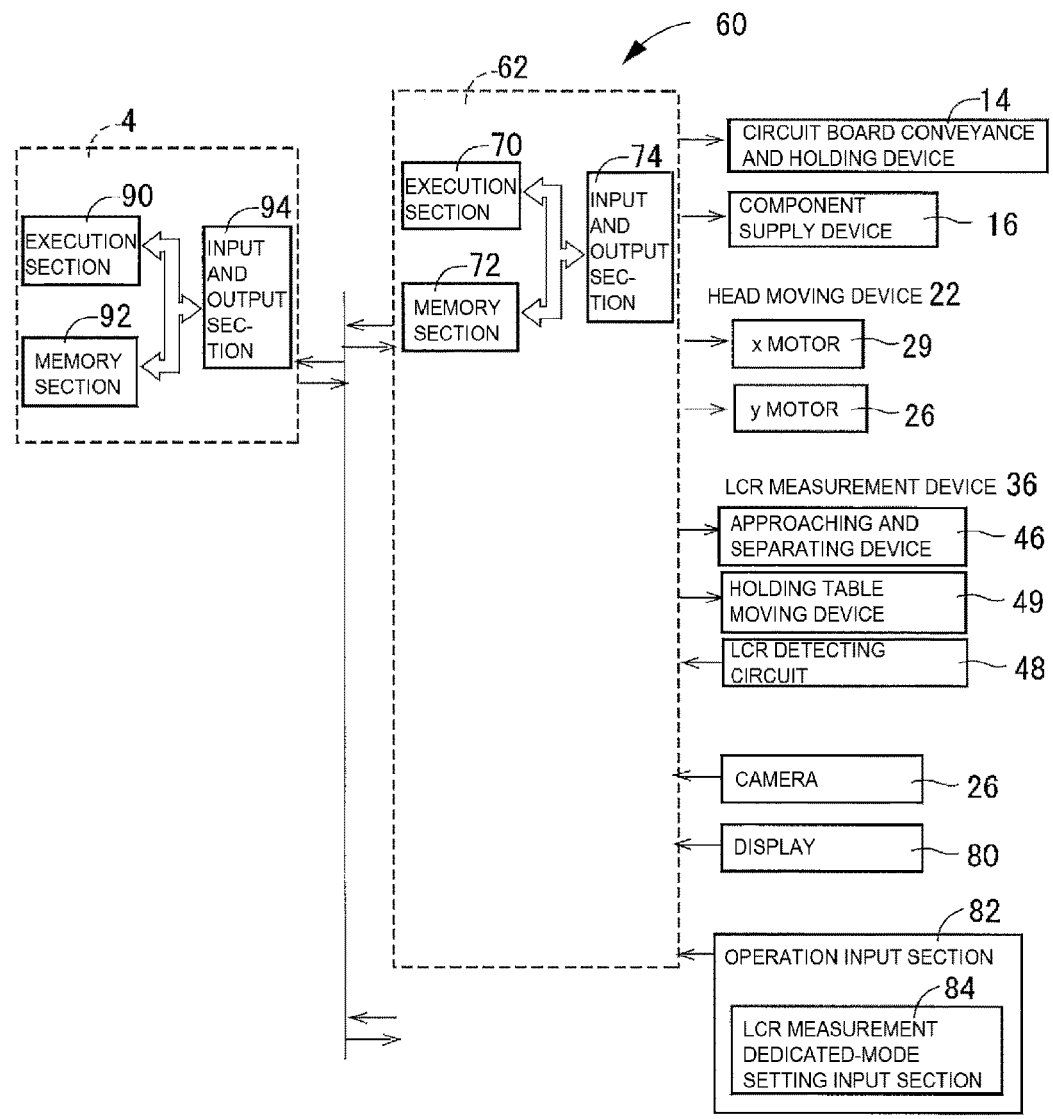
FIG. 6 is a conceptual diagram showing the periphery of a control section of the component mounting system.

Component mounting machine 2 includes control device 60. As shown in FIG. 6, control device 60 includes controller 62 mainly composed of a computer, multiple drive circuits (not shown), and the like. Controller 62 includes execution section 70, memory section 72, input and output section 74, and the like, and input and output section 74 is connected via drive circuits (not shown) to circuit board conveyance and holding device 14, component supply device 16, and head moving device 22, and input and output section 74 is further connected to camera 34, LCR measurement device 36, display 80, operation input section 82, and the like. When display 80 has a function as a touch panel, display 80 may perform at least a part of the function of operation input section 82. Operation input section 82 includes LCR measurement dedicated-mode setting input section 84. Further, host computer 4 is connected to controller 62 so as to be able to communicate. Host computer 4 includes execution section 90, memory section 92, input and output section 94, and the like, and memory section 82 stores work plan information, IDs of reels 8, and the like in each of component mounting machines 2.

In component mounting machine 2 of the component mounting system configured as described above, the mounting work is performed such that component tape 6 is fed by tape feeder 20, component s that has reached a component supply position is picked up and conveyed with suction nozzle 23, and component s is released at a predetermined position of board P and mounted thereon. In some cases, a placing work is performed such that component s, picked up with suction nozzle 23, is carried to component holding table 40 of LCR measurement device 36 and is released and placed. Further, when component s is placed on component holding table 40, measurement, appropriateness determination, and the like of the LCR of component s are performed.

Figure 9:
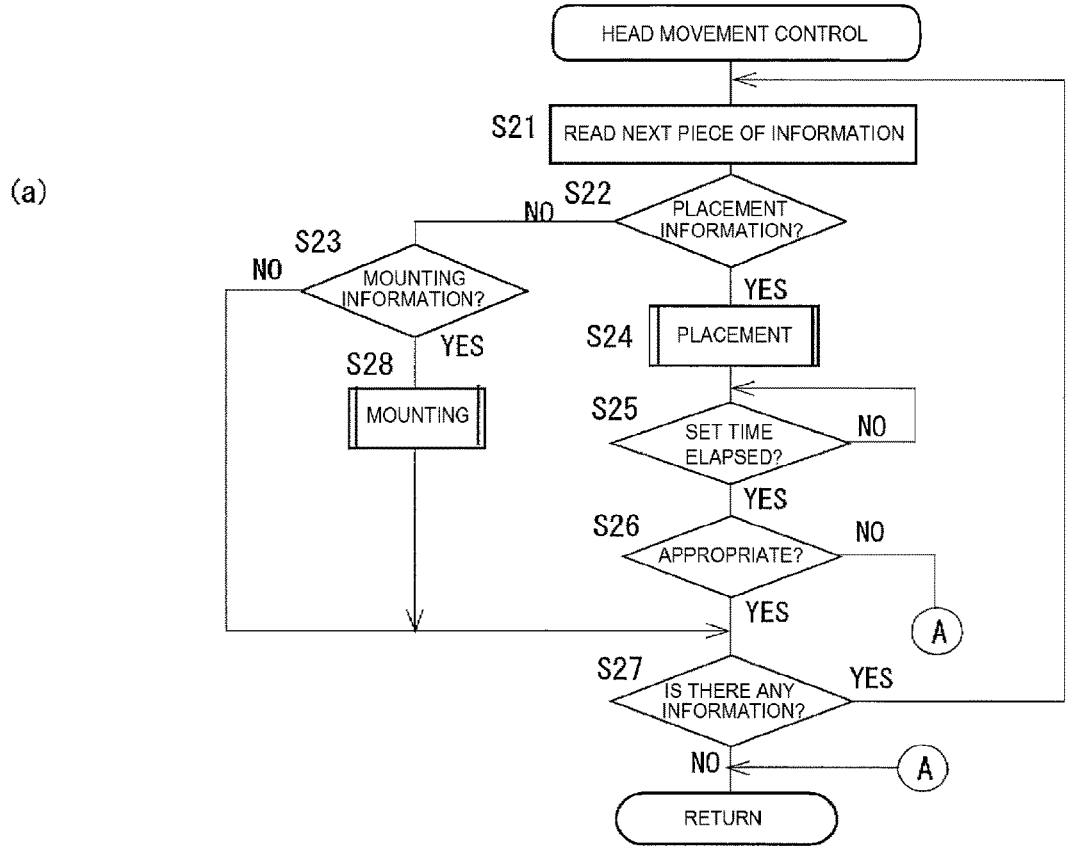
FIG. 9(a) is a flowchart showing a head movement control program stored in the memory section.
FIG. 9(b) is a flowchart showing a program for LCR measurement and the like stored in the memory section.
Figure 9:
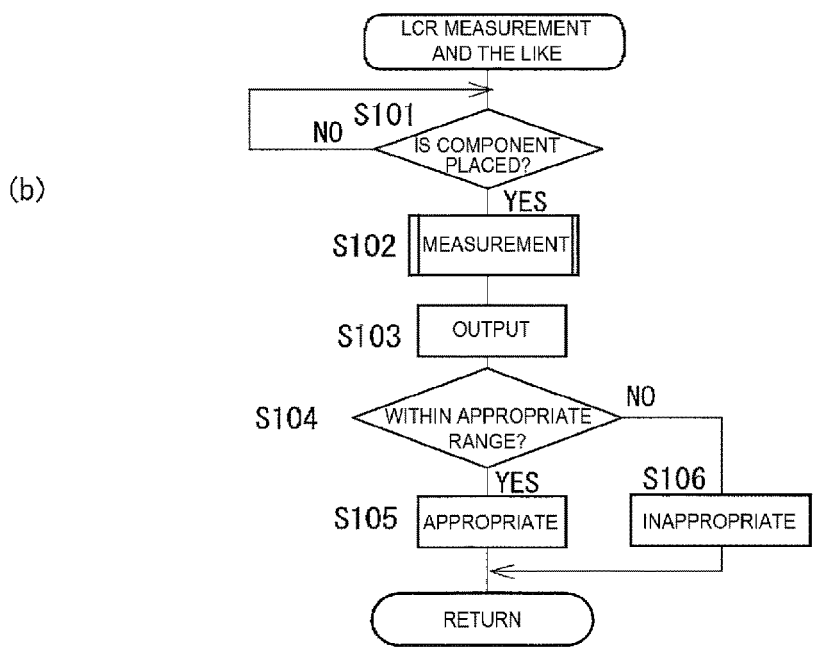

In the present embodiment, the measurement and the appropriateness determination of LCR of component s are performed by executing a program for LCR measurement and the like shown in the flowchart of FIG. 9(b).

In step 101 (hereinafter, abbreviated as S101. The same applies to the other steps), it is determined whether component s is placed on the component holding table. When suction nozzle 23 is moved to component holding table 40 and releases component s, the determination is YES, and the LCR is measured in S102. Measurement parts 42 and 44 approach each other with approaching and separating device 46 and grasps component s from both sides, component holding table 40 is moved from the initial position to the measurement position with holding table moving device 49, and in this state, a current is flown through component s, and the LCR value is obtained in LCR detecting circuit 48. In S103, LCR value information, which is information representing the LCR value, is output to host computer 4, and in S104, it is determined whether the LCR value is within an appropriate range determined by the standard value and the tolerance. When the LCR value falls within the appropriate range, the LCR value is determined to be appropriate in S105, and when the LCR value falls outside the appropriate range, the LCR value is determined to be inappropriate in S106. When it is determined that the LCR value is inappropriate, for example, information indicating this determination, an instruction to exchange reel 8, or the like can be displayed on display 80.

On the other hand, component mounting machine 2 is supplied with a mounting sequence {a data group configured such that multiple pieces of "mounting information including information specifying component s to be mounted, a mounting position (x, y) on board P, and the like" and the like are arranged in order of work} from host computer 4 in advance. Then, an operator takes reel 8, on which component tape 6 holding components s used in the mounting work is wound, out of the depository, causes tape feeder 20 to hold the reel, and attaches the tape feeder to component mounting machine 2 (hereinafter simply referred to as attaching reel 8 to component mounting machine 2). Then, the reel ID and the like are read and reported to host computer 4. After host computer 4 checks the reel ID and the like and determines that the reel ID and the like are appropriate, the mounting work is performed in component mounting machine 2.

In component mounting machine 2, based on the mounting sequence supplied from host computer 4, a mounting and placing sequence which is a data group configured such that multiple pieces of mounting information, multiple pieces of "information for specifying component s, placement information including a component mounting position (x0, y0) on component holding table 40, and the like", and the like are arranged in order of work is generated and stored in memory section 72.

Placement information and the like may be added in host computer 4 so that the mounting and placing sequence is supplied to component mounting machine 2.

In the present embodiment, for each of reels 8, component s positioned at the leading end and at least one component s positioned in the middle, when component tape 6 is new, are each set as a measurement target of LCR. Components s positioned in the middle can be components s excluding components s at the leading end and the tail among many components s held on component tape 6 when component tape 6 is new, and components s at the leading end portion can be a first set number NS of components s from the leading end including component s positioned at the leading end. The first set number NS may be, for example, 1 or more and 30 or less, and may be 2 or more, 5 or more, 7 or more, 10 or more, 15 or more, 25 or less, 20 or less, or the like.

More specifically, multiple components s positioned for every second set number starting from component s (first component s) at the leading end position when component tape 6 is new are set as measurement targets of LCR. The second set number NA is a number larger than the first set number NS, and may be, for example, 5 or more and 200 or less, or may be 20, 30, 50, 70, 100, 150, or the like. With respect to reel 8 attached to component mounting machine 2, the number of used components, which is the number of components s used in the mounting work, is counted for each reel (the counted number of used components is defined as C), and each time the mounting work on one board P is completed, the number of used components is reported to host computer 4 from component mounting machine 2 and stored in association with the ID of reel 8. Therefore, even if reel 8 attached to component mounting machine 2 is new or used, or even during the mounting work, it can be determined that component s positioned at the leading end is the (C+1)th components from the leading end position when the reel is new.

Figure 7:
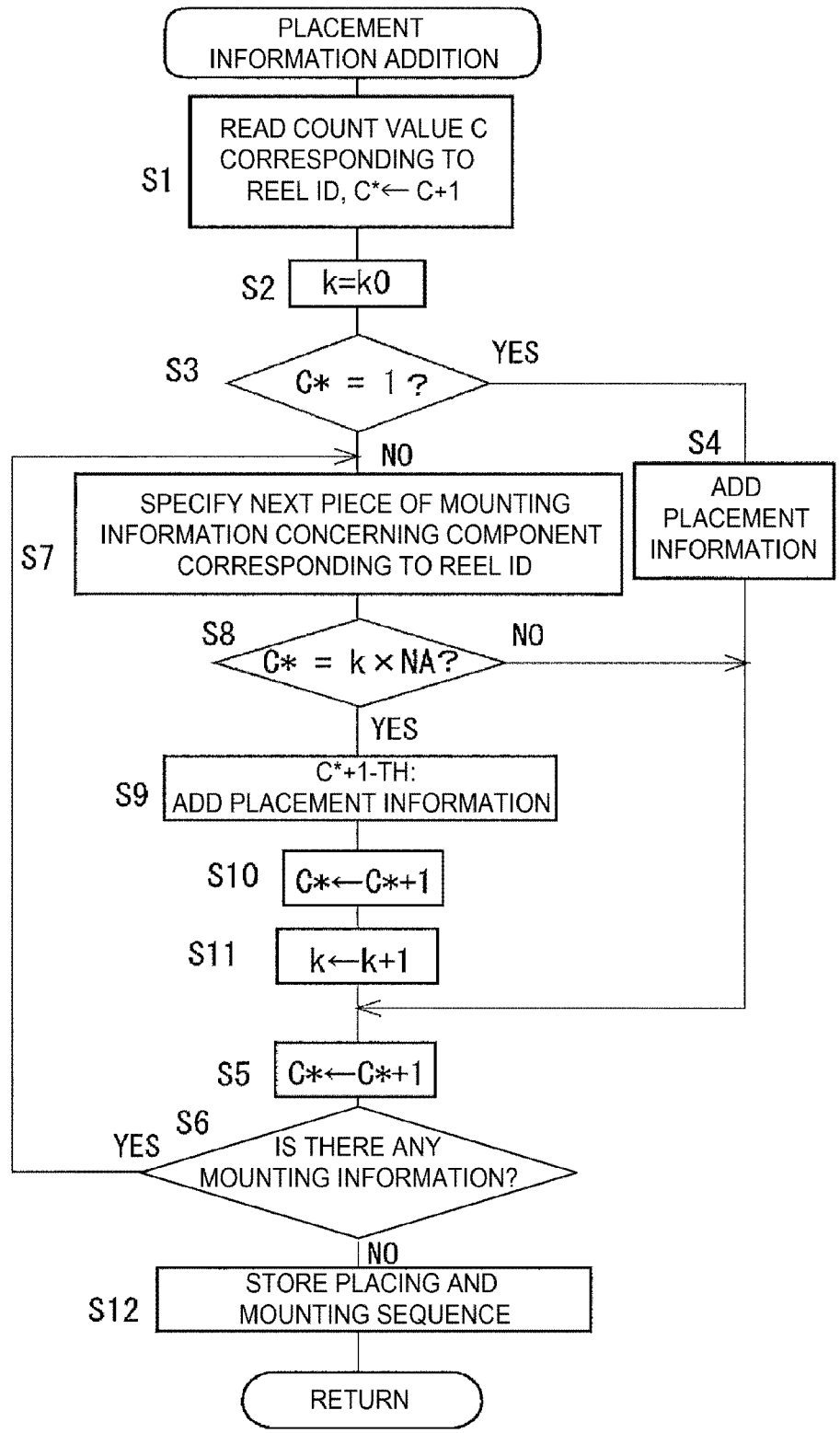
FIG. 7 is a flowchart showing a placement information addition program stored in a memory section of a control device of the component mounting machine.

In the component mounting machine, every time when a component mounting on each of multiple boards P is started, that is, at a predetermined timing between the time point when mounting of the components on board P is completed and the time point when the next board is carried in, a placement information addition program represented by the flowchart of FIG. 7 is executed, and the mounting and placing sequence is generated. This program is executed for each of the multiple reels attached to component mounting machine 2, but in the present description, a case where the program is executed for reel A of IDa will be described.

In S1, the number of used components C stored in association with the ID (reel IDa) of reel 8 is read into host computer 4, and a value obtained by adding 1 to the number of used components C is set as an initial value (C*=C+1) of the count value C* of a scheduled counter. The scheduled counter counts the total number of used components C and the number of component s to be used in the future, and the initial value is the number (C+1) of component s positioned at the leading end of component tape 6 at each time point when mounting of a component on each of boards P is started, when counted from component s positioned at the leading end when the component tape is new. Hereinafter, the count value of the scheduled counter will be abbreviated as a scheduled count value in the present description. Next, in S2, the initial value k0 of an integer variable k is determined (k←k0). The initial value k0 is a value obtained by adding 1 to an integer portion of the value of (C*/NA), but when the scheduled count value C* is 1 (for example, when reel 8 is new and mounting of a component on first board P is started), the initial value k0 is also 1.

In S3, it is determined whether the scheduled count value C* is 1. If the determination is YES, placement information is added in S4, and the scheduled count value C* is incremented by 1 in S5. Component s having the scheduled count value C* of 1 is set as a measurement target. Then, in S6, it is determined whether any mounting information remains in the data group of mounting information included in the mounting sequence for one board P (hereinafter, sometimes simply referred to as a "data group for one board"). In this case, since the determination is YES, S7 is executed.

On the other hand, when the scheduled count value C* is not 1, mounting information is sequentially read one by one from the data group for one board, but in this embodiment, mounting information of components s corresponding to the reel IDa is sequentially specified in S7. In S8, it is determined whether the scheduled count value C* satisfies an expression (C*=k×NA), that is, whether the scheduled count value is k times the set number NA. If the above expression is not satisfied, the determination is NO, and after S5 and S6 are executed, the process returns to S7. When the scheduled count value C* becomes k times the set number NA while S7, S8, S5, and S6 are repeatedly executed, the determination of S8 becomes YES, and placement information of component s corresponding to the reel IDa is next added in S9. Component s as a measurement target is (k×NA+1)th components in reel A. In S10, the scheduled count value C* is incremented by 1, and in S11, the variable k is incremented by 1. Hereinafter, after S5 and S6 are executed, S7 and subsequent steps are executed, and these steps are repeatedly executed until all mounting information is read from the data group for one board, and in S12, the mounting and placing sequence is generated and stored in memory section 72.

Figure 8:
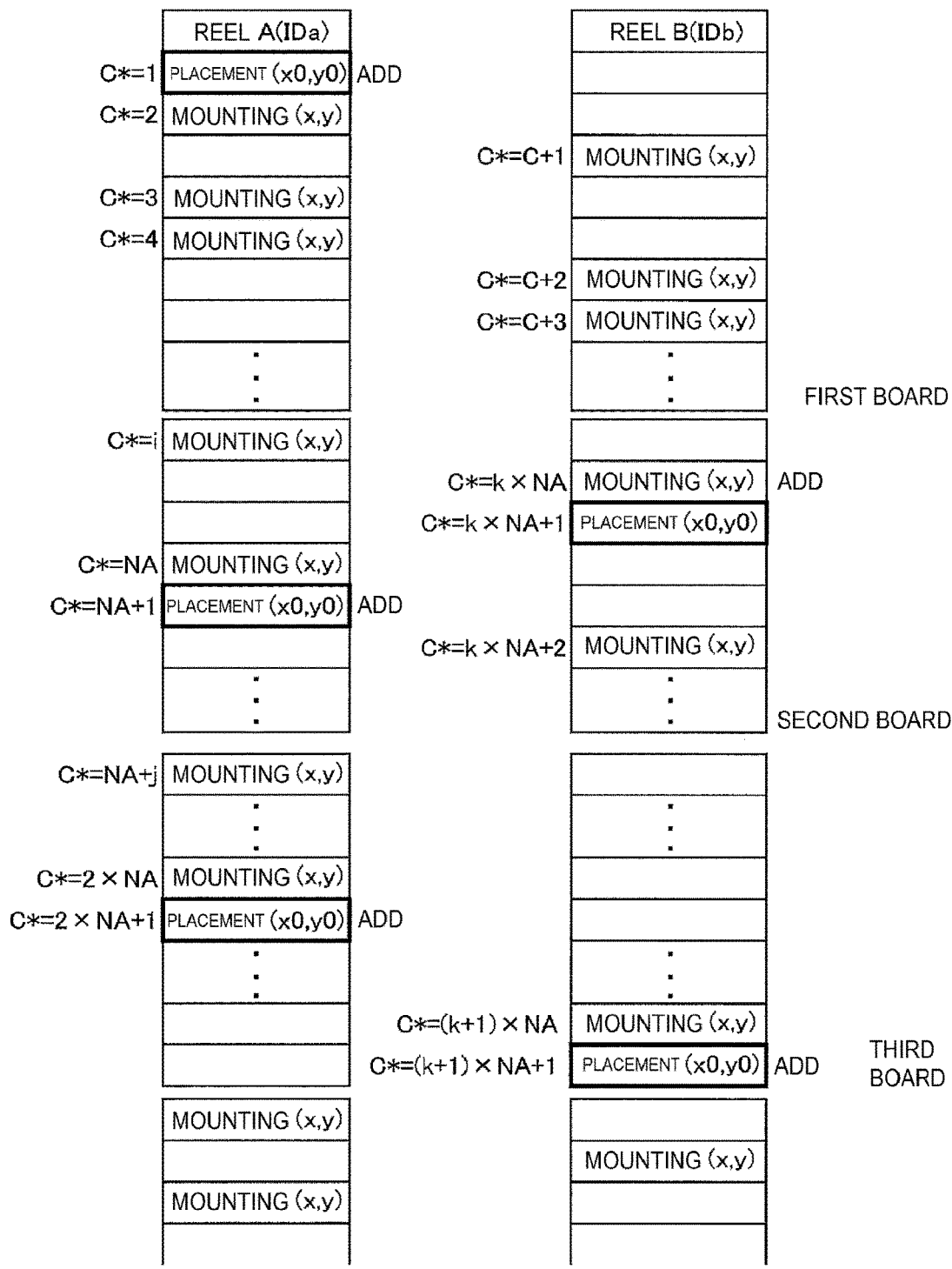
FIG. 8 is a diagram conceptually showing an example of a mounting and placing sequence generated by executing the program.

FIG. 8 conceptually shows an example of the mounting and placing sequence generated as described above. In the case where reel A added with IDa is new, first component s, (NA+1)th component s, (2×NA+1)th component s are set as measurement targets, and placement information is added after each of NA-th and (2×NA)th pieces of mounting information. Since reel B added with IDb is used, component s positioned at the leading end in the state where reel B is attached to component mounting machine 2 is not a measurement target at this time. In the case of a new, (K×NA+1)th component s and {(k+1)×NA+1}th component s counted from component s positioned at the leading end are set as measurement targets.

In component mounting machine 2, a head movement control program shown in the flowchart of FIG. 9(a) is executed. In S21, information included in the mounting and placing sequence is sequentially read one by one. In S22 and S23, it is determined whether the read information is placement information or mounting information. If the read information is placement information, the placing work is performed in S24, the elapse of a set time is waited out in S25, and it is determined in S26 whether the determination result of the LCR value is appropriate. If the determination result is appropriate, it is determined in S27 whether any information remains in the mounting and placing sequence, and if any information remains, the process returns to S21. On the other hand, when the read information is mounting information, the mounting work is performed in S28. Hereinafter, S21 to S28 are repeatedly executed while the mounting and placing sequence includes any information. If the LCR value is inappropriate, this routine is stopped and the reel exchange and the like are performed.

As described above, in the present embodiment, the mounting work is not performed during the set time (S25) in which the measurement and the determination of appropriateness of LCR are performed. After the mounting work is stopped, and LCR is measured and determined to be appropriate, the mounting work is restarted.

Figure 10:
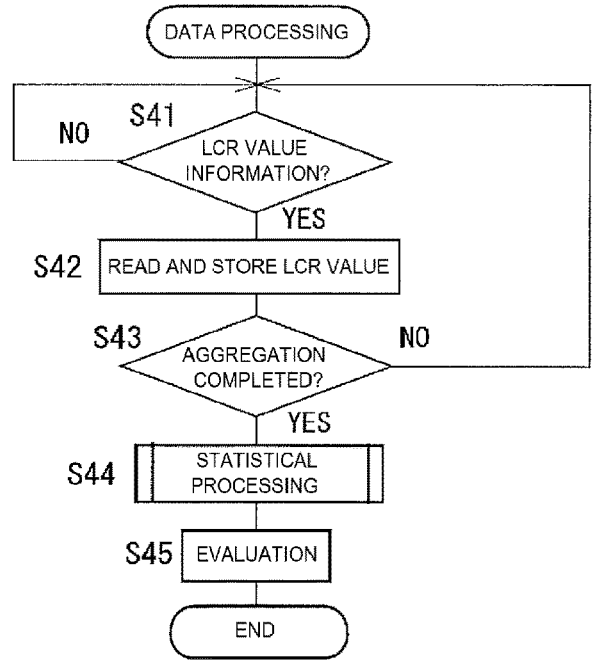
FIG. 10 is a flowchart showing a data processing program stored in a memory section of a host computer of the component mounting system.

In host computer 4, the data processing program shown in the flowchart of FIG. 10 is executed. In S41 and S42, it is determined whether the LCR value information is supplied from component mounting machine 2, and if the determination is YES, the LCR value information is read and stored. Then, in S43, it is determined whether the aggregation has been completed. For example, in the case where the LCR value information of all components s to be measured in one reel 8 is stored, when the LCR value information of a predetermined number or more are stored, or when reel 8 is discarded, or the like, it is determined that the aggregation is completed. When the aggregation is not completed, S41 to S43 are repeatedly executed, and when the aggregation is completed, a statistical processing is performed in S44, and the evaluation is performed in S45.

The data processing program is not necessarily performed in the series of mounting works in component mounting machine 2, and may be performed over multiple times of mounting work performed in the same component mounting machine 2 or different component mounting machines.

Figure 11:
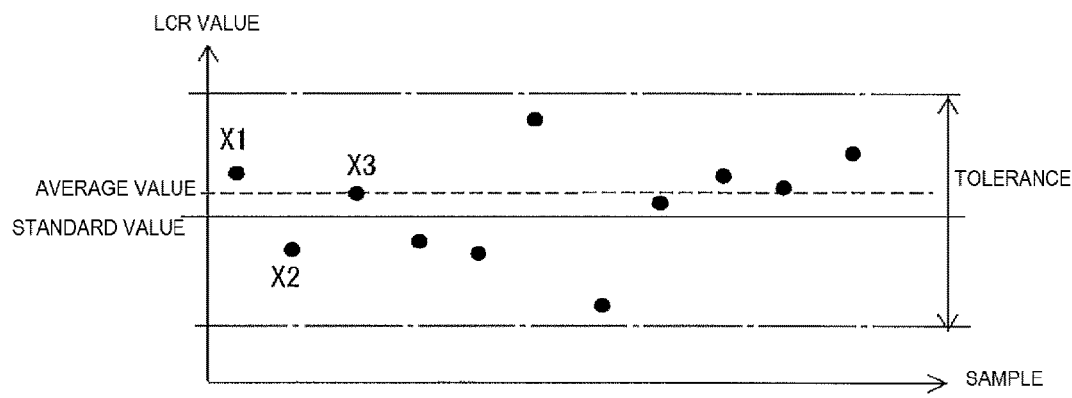
FIG. 11(a) is a diagram showing measured LCR values.
FIG. 11(b) is a diagram showing the variation in the LCR values.

For example, as shown in FIG. 11(a), in the case where the LCR values of components s as measurement targets such as first component s, (NA+1)th component s, and the like are X1, X2, X3, and the like for reel A, the LCR values can be processed and represented by a graph as shown in FIG. 11(b). As a result, variation, the difference of the average value from the standard value, the ratio of the LCT values which deviate from the appropriate range, the degree of deviation, and the like can be easily understood. Also, multiple pieces of the LCR value information can be processed to obtain an average value, a variance, a standard deviation, and the like, and for example, when the value of the variance is small and the difference between the average value and the standard value is small, determination can be made that the evaluation on the electrical characteristics of many components s (population) held on component tape 6 wound on reel 8 is high.

As described above, in the present embodiment, the electrical characteristics of multiple components s including components s positioned in the middle among many components s that are held side by side in the longitudinal direction on component tape 6 are measured. As a result, even if the component tape is such that component s positioned at the leading end is of high quality and component s positioned in the middle is of poor quality, this can be easily detected. Further, as compared with the case based only on the LCR value of component s positioned at the leading end of component tape 6, it is possible to optimize the sampling, and it is possible to more accurately estimate the electrical characteristics of many components s (population) and to more accurately evaluate the electrical characteristics. In addition, in order to measure the LCR of component s positioned in the middle among many components s held on component tape 6, the component s must be taken out by unwinding component tape 6 from reel 8, which is very difficult. On the other hand, in the present embodiment, since LCR is measured in the mounting work of component s, the above-described operation becomes unnecessary.

Further, LCR is measured in the state where the mounting work is stopped, and when LCR is inappropriate, the exchange of reel 8 or the like is instructed. Therefore, an occurrence of a defective board can be prevented in advance. Further, multiple component mounting machines 2 having a common supplier of reels 8 are connected to host computer 4. Therefore, LCR values required for the statistical processing can be aggregated at an early stage as compared with the case where there is only one connected component mounting machine 2. It is also possible to aggregate LCR values for each of many reels 8, and to perform comparison between reels relating to the electrical characteristics of components s of the same type, comparison between component manufacturers, comparison of quality relating to the electrical characteristics of each type of components s, and the like.

It should be noted that the generation of the mounting sequence and the like can be performed by controller 62 of component mounting machine 2, controller 62 operating in conjunction with host computer 4, or the like. The determination of the appropriateness of an LCR value may be performed in host computer 4. In addition, starting component (first component) s of the second set number NA may be component s positioned at the leading end when reel 8 is attached to component mounting machine 2 {(C+1) th component s when counted from the leading end position when the reel is new}. In the data processing program, S45 is not indispensable. The evaluation can be performed by a component manufacturer or an operator.

As described above, in the present embodiment, a head movement control device is configured by a portion for storing the mounting and placing sequence shown in FIG. 8 of control device 60, a portion for storing S24 and S28, a portion for executing these steps, and the like. Of the head movement control device, a measuring-time movement control section is configured by a portion for storing the placement information, a portion for storing S24, a portion for executing the step, and the like, and a mounting-time movement control section includes a portion for storing the mounting information, a portion for storing S28, a portion for executing the step, and the like. Further, the step of measuring LCR of component s mounted on component holding table 40 by executing the head movement control program of FIG. 9(a), based on the mounting and placing sequence of FIG. 8 generated by executing the placing information addition program of FIG. 7, in S102 of the program for LCR measurement and the like of FIG. 9(b) corresponds to a measurement step, the execution of S44 corresponds to a processing step, and the execution of S45 corresponds to an evaluation step. Further, the execution of the measurement step described above corresponds to the execution of the electrical characteristic measurement method.

Second Embodiment

Figure 12:
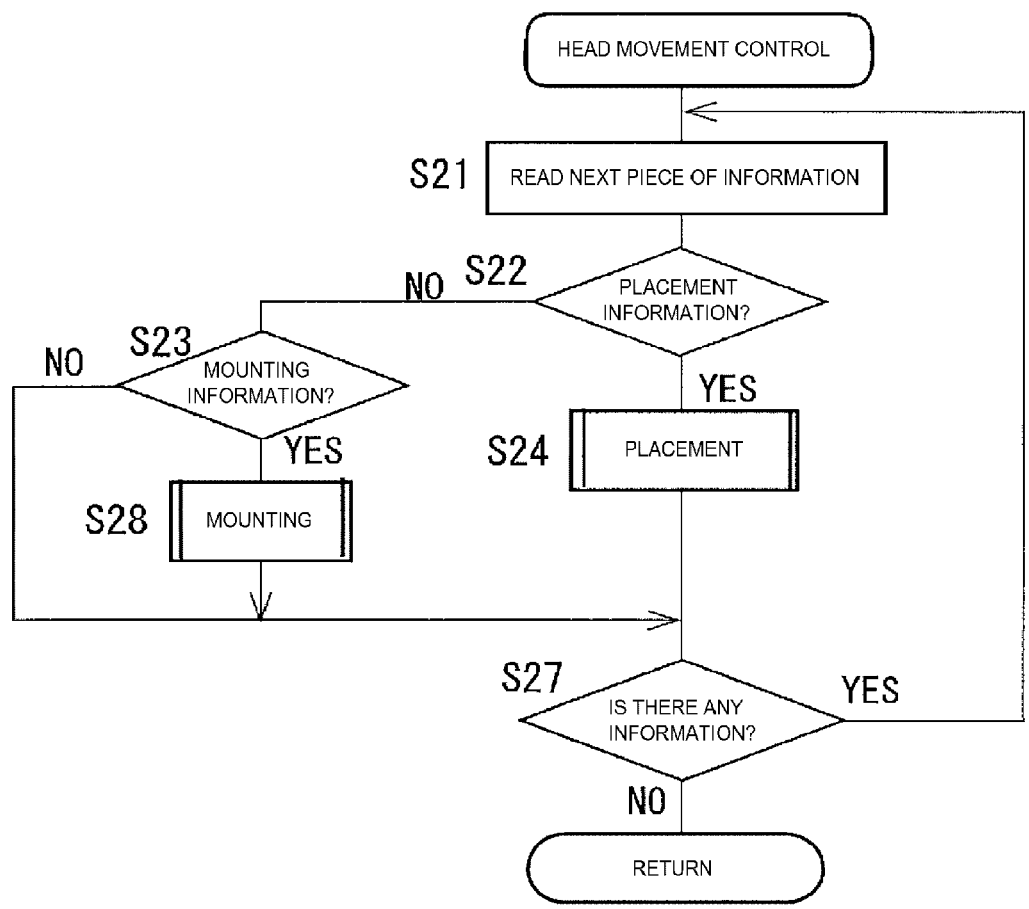
FIG. 12 is a flowchart showing a head movement control program stored in the memory section of the control device of the component mounting machine of the component mounting system which can implement a method according to a second embodiment of the present disclosure.

In the present embodiment, the LCR measurement and the like are performed in parallel with the mounting work in component mounting machine 2. In the present embodiment, a head movement control program represented by the flowchart of FIG. 12 does not include S25 or S26 of the flowchart of FIG. 9(a). Therefore, the placing work and the mounting work are continuously performed. In other words, when the placing work is performed (S24), LCR is measured by executing the program for LCR measurement and the like, and the mounting work is performed by executing the head movement control program in parallel with the measurement. In LCR measurement device 36, approaching and separating device 46 and holding table moving device 49 can be driven independently of head moving device 22, and LCR detecting circuit 48 can measure LCR of component s.

As described above, in the present embodiment, the time required for the mounting work in component mounting machine 2 can be shortened.

The present disclosure can also be implemented in a mode in which the first embodiment and the second embodiment are combined. For example, the measurement of LCR of a component whose scheduled count value C* is 1 (component positioned at the leading end) may be performed after the mounting of the component is stopped, and the measurement of LCR of the other components may be performed in parallel with the mounting of the component. In the present embodiment, it is possible to shorten the time required for the mounting work while preventing an occurrence of a defective board due to an attachment error or the like of reel 8.

Before the start of the mounting work, LCR of the component at the leading end position is measured, and when the measured value is determined to be appropriate, the mounting work of components supplied by the component tape can be started. Then, after the mounting work is started, LCR of component s positioned in the middle of component tape 6 can be measured in a mode of the first embodiment, the second embodiment, or the combination of the first embodiment and the second embodiment.

Third Embodiment

In the present embodiment, components s as measurement targets are randomly selected. For example, when component s positioned at the leading end among many components s, which are held in a line in the longitudinal direction on component tape 6 that is wound on reel 8 as new or used one, is set to 1, the components are associated with respective numerical values in sequential order, and component s corresponding to a numerical value next to a numerical value that matches a random number x {component s corresponding to a numerical value (x+1)} can be set as a measurement target of LCR. Further, at least one random number x is generated in a range of two or more and equal to or less than a numerical value representing the number of components s held on component tape 6, that is, a numerical value corresponding to the component positioned at the tail.

Figure 13:
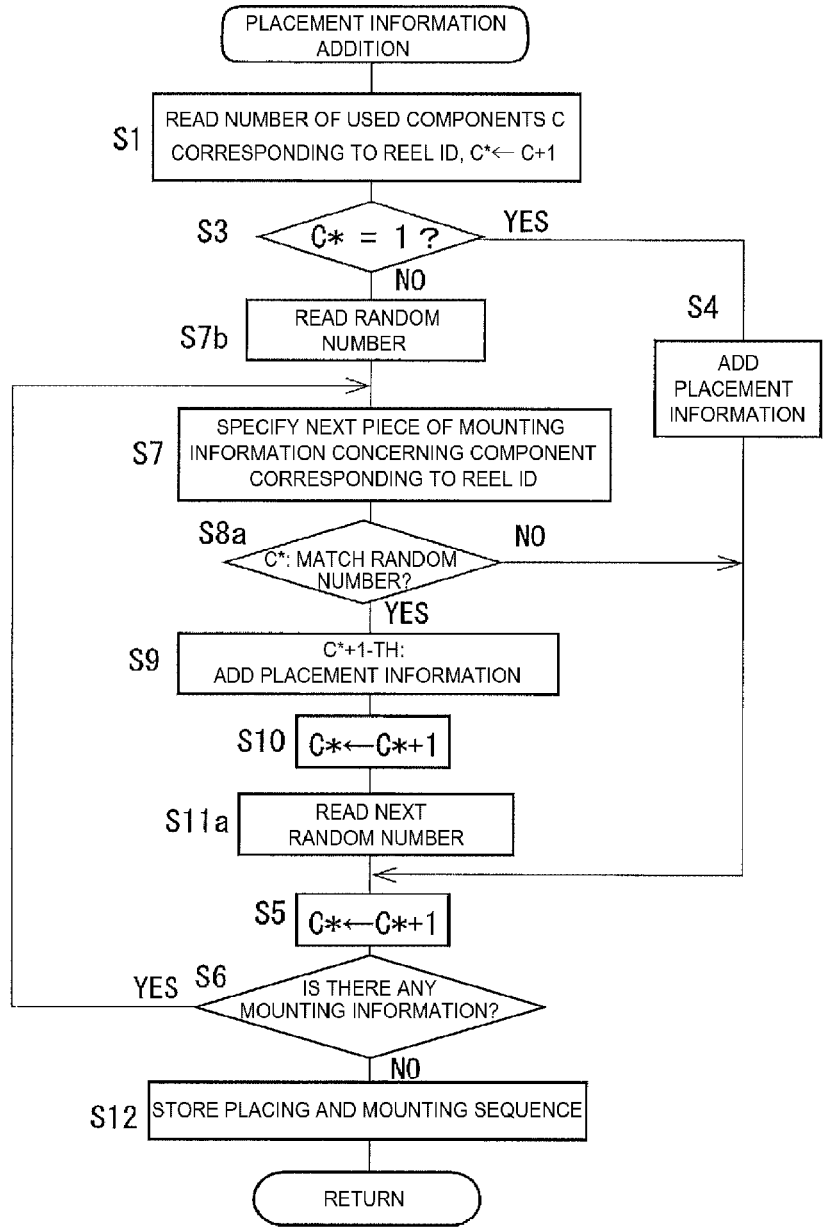
FIG. 13 is a flowchart showing a placement information addition program stored in the memory section of the control device of the component mounting machine of the component mounting system which can implement a method according to a third embodiment of the present disclosure.

In the present embodiment, the placement information addition program shown in the flowchart of FIG. 13 is executed. In the flowchart of FIG. 13, steps in which the same processing as that of the placement information addition program shown in the flowchart of FIG. 7 is executed are denoted by the same step numbers, and descriptions thereof are omitted.

When the determination of S3 is NO, the minimum random number x is read in S7b, and it is determined whether the scheduled count value C* matches the random number x in S8a. If they match with each other, the determination is YES, and placement information is added next in S9. Then, in S11a, the next smaller random number x is read, S5 and S6 are executed, and S7 and S8a are executed. Thereafter, S5, S6, S7, and S8a are repeatedly executed until the scheduled count value C* matches the random number x. As described above, since component s as the measurement target of LCR is randomly selected, the electrical characteristics of the population can be estimated more accurately.

In S9, placement information may be added before the mounting information of component s corresponding to the numerical value matched the random number x. In this case, component s corresponding to the numerical value x is set as a measurement target. It is also possible to select a component as a measurement target by associating component s, which is positioned at the leading end position when reel 8 is attached to component mounting machine 2, with the numerical value 1.

Fourth Embodiment

In component mounting machine 2 of the present embodiment, the LCR measurement dedicated mode can be set by the operation of an operator, and when the LCR measurement dedicated mode is set, LCR of all components s of component tape 6 wound on reel 8 is continuously measured.

"Continuous" means that the mounting work is not performed in the middle of the measurement of LCR, and the measurement is performed in accordance with the placing sequence including the placement information and not including the mounting information. "All" means all components held on component tape 6 at that time, and reel 8 may be a new or used reel.

Figure 14:
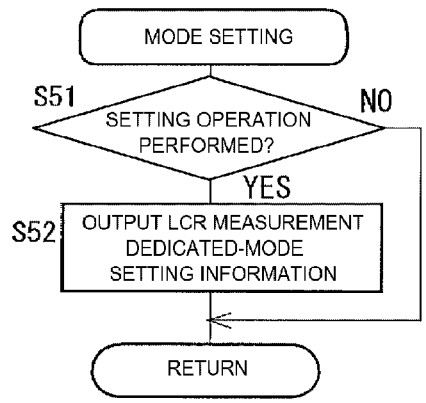
FIG. 14 is a flowchart showing a mode setting program stored in the memory section of the control device of the component mounting machine of the component mounting system which can implement a method according to a fourth embodiment of the present disclosure.

In component mounting machine 2, in S51 of a mode setting program represented by the flowchart of FIG. 14, it is determined whether an operation for setting the LCR measurement dedicated mode has been performed by the operation of LCR measurement dedicated-mode setting input section 84, and if the setting operation has been performed, information indicating that the LCR measurement dedicated mode has been set is output to host computer 4 in S52.

Figure 15:
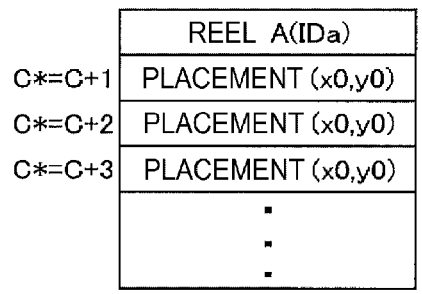
FIG. 15 is a diagram conceptually showing an example of a placing sequence generated in the control device.
Figure 16:
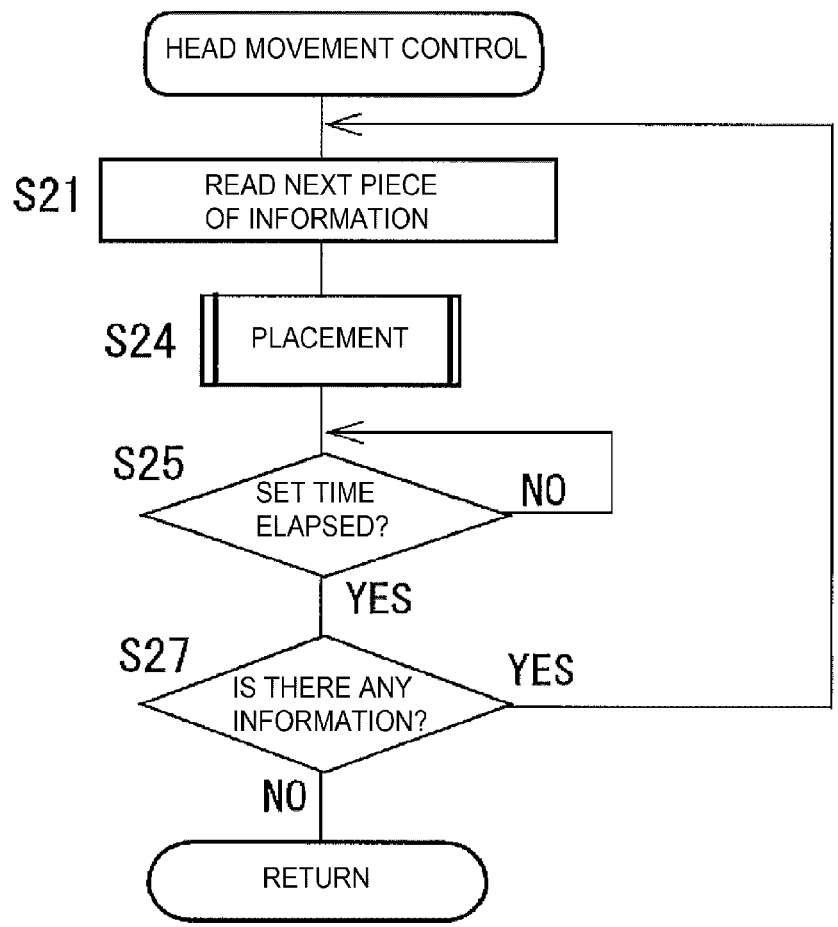
FIG. 16 is a flowchart showing a head movement control program stored in the memory section.

When the LCR measurement dedicated mode is set, a placing sequence is generated in component mounting machine 2 as conceptually shown in FIG. 15. Although a head movement control program represented by the flowchart of FIG. 16 is executed, the head movement control program does not include S22, S23, S26, or S28 of the head movement control program in the first embodiment. Therefore, for example, multiple components s held on component tape 6 of reel A are picked up and conveyed with suction nozzle 23 at set time intervals (S25) in order from the leading end, and are placed on component holding table 40.

LCR value information is supplied to host computer 4 each time of the measurement. In host computer 4, a data processing shown in the flowchart of FIG. 10 is performed in the same manner as in the above-described embodiments, but when the LCR values of all components s held on reel A are stored, it is determined that the aggregation is completed in S43. It should be noted that it is not always necessary to determine whether an LCR value is appropriate in the program for LCR measurement and the like (S104 to S106 are not indispensable). It is also possible to use multi-head 32 instead of single head 21, in which case the number of movements of head 32 can be reduced.

As described above, in the present embodiment, since LCR of all components s held on component tape 6 wound on reel 8 is measured, it is possible to evaluate the electrical characteristics of many components s more accurately. Further, for example, in any of the first to third embodiments, when it is determined that an LCR value is inappropriate as a result of the LCR measurement performed in the middle of the mounting work, the LCR measurement may be performed for all components s remaining in component tape 6 of reel 8.

The data processing can be performed, for example, in the control device of component mounting machine 2, or in an external computer connected to component mounting machine 2 on a one-to-one basis.

It is also possible to use component mounting machine 2, in which head moving device 22 is controlled in accordance with the sequence of FIG. 15 and LCR of component s is measured, as a dedicated electrical characteristic measurement machine in which only the measurement of LCR is performed and mounting work is not performed. In this case, circuit board conveyance and holding device 14 is not indispensable.

Furthermore, it is also possible that an operator may input the number of components s for which measurement of LCR is desired instead of all components s held on reel 8, so that LCR of the input number of components s is continuously measured. In this case, a number larger than the first set number NS is input.

Fifth Embodiment

In this embodiment, head (multi-head) 32 shown in FIG. 3(b) is attached to x slider 31. In the mounting work, in principle, components s are continuously held with all MA (8 in this embodiment) suction nozzles 33, and all held components s are mounted on board P one after another. Hereinafter, this operation is referred to as "one mounting operation with head 32".

Therefore, for example, when component s as a measurement target is picked up fourth in a sequence of eight suction nozzles 33, head 32 is moved from board P to LCR measurement device 36 in order to measure LCR of the component s, which is not desirable. Therefore, in the present embodiment, after the one mounting operation with head 32 is completed, the component s is picked up with one of eight suction nozzles 33 and placed on component holding table 40.

Figure 17:
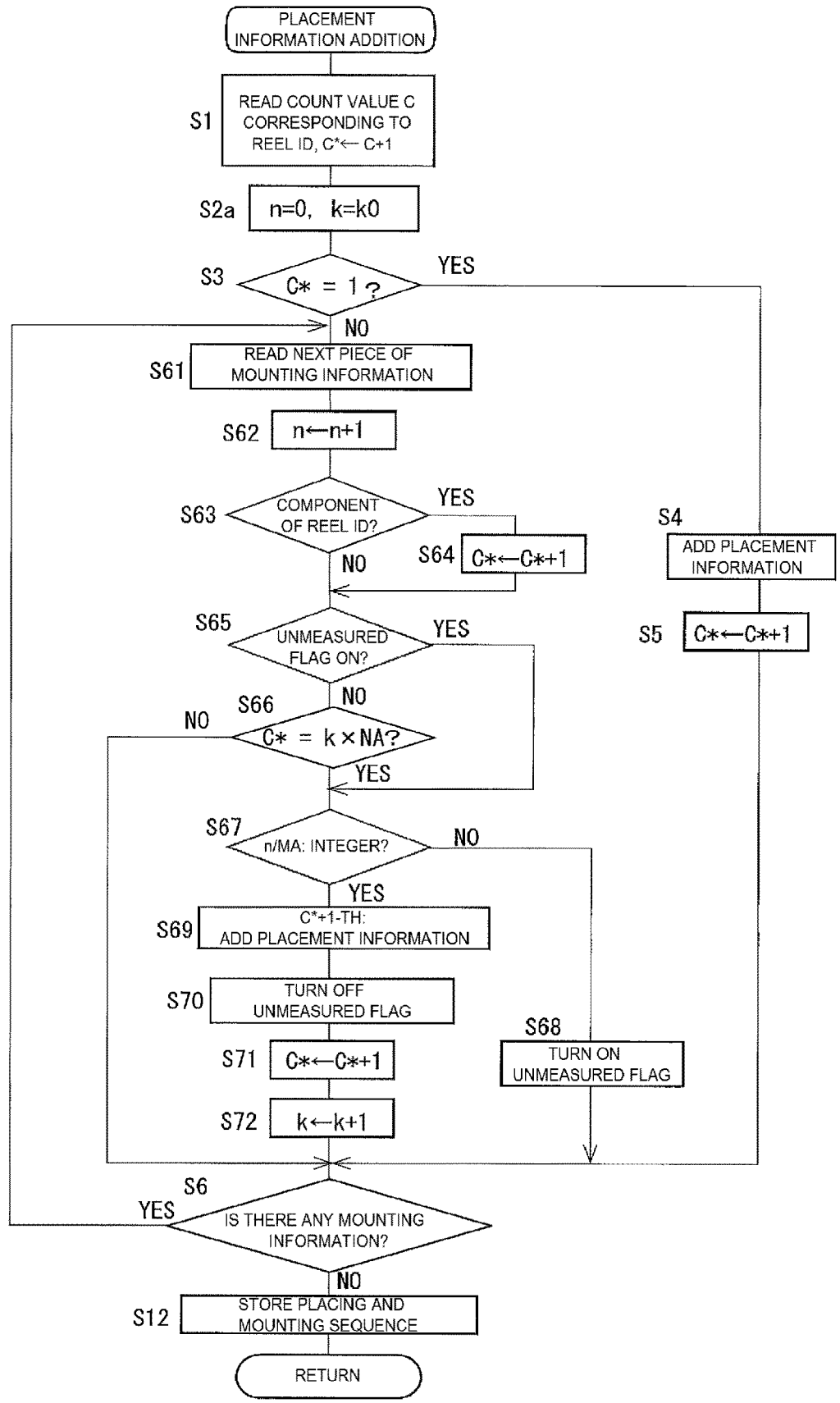
FIG. 17 is a flowchart showing a placement information addition program stored in the memory section of the control device of the component mounting machine of the component mounting system which can implement a method according to a fifth embodiment of the present disclosure.

In component mounting machine 2, a placement information addition program shown in the flowchart of FIG. 17 is executed. In the flowchart of FIG. 17, steps in which the same processing as that of the placement information addition program shown in the flowchart of FIG. 7 is performed are given the same step numbers, and description thereof is omitted.

In S61 and S62, mounting information included in the mounting sequence is sequentially specified and counted. n is the number from the leading end in the mounting information included in the mounting sequence, and is the count value of a number counter for counting the number. In S63, it is determined whether the specified mounting information is mounting information of component s corresponding to the reel IDa, and if the determination is YES, the scheduled count value C* is incremented by 1 in S64. In S65, it is determined whether an unmeasured flag described later is ON, and if the determination is NO, it is determined in S66 whether the scheduled count value C* of component s corresponding to the reel IDa satisfies an expression (C*=k× NA), and it is determined in S67 whether the number n of the pieces of mounting information is a multiple of MA(8). When the determination in S66 is YES and the determination in S67 is NO, it is not desirable to add the placement information, and so, in S68, the unmeasured flag is set to ON and the addition of the placement information is postponed. The unmeasured flag is a flag that is turned ON when the placement information to be added is not added.

When the unmeasured flag is ON, S67 is executed without executing S66, and the processing stays until the number n of pieces of mounting information becomes a multiple of MA. During this time, S68, S6, S61 to S63 (S64), S65, and S67 are repeatedly executed. When the determination in S67 becomes YES, a piece of the placement information is added for component s having the scheduled count value C*+1 in S69. In S70 to S72, the unmeasured flag is turned OFF, the scheduled count value C* is incremented by 1, and the variable k is incremented by 1.

The count value n of the number counter may be reset to 0 every time when the count of pieces of the mounting information for one board is started (S2a), or not be reset until a series of the mounting works are completed.

FIG. 18 conceptually shows an example of the generated mounting and placing sequence. As shown in FIG. 18, when the scheduled count value C* reaches the set number NA, since the value (n/MA) obtained by dividing the number n by the number MA is not an integer, placement information is not added at that time point, and placement information is added after the value of n/MA becomes an integer. In this manner, when multi-head 32 is attached, component s separated by several components s from component s positioned for every second set number NA may be set as a measurement target.

In the present embodiment, it is preferable that the second set number NA is larger than the number MA. In addition, placement information (n=MA×i+1) may be added when the value of n/MA becomes an integer (n=MA×i) before the scheduled count value C* satisfies the expression (C*=NA× k).

Although the present disclosure has been described above based on the multiple embodiments, the present disclosure can be implemented, for example, by combining the multiple embodiments with each other, and the present disclosure can be implemented in a mode in which various changes and improvements are made based on the knowledge of a person skilled in the art.

REFERENCE SIGNS LIST

2: component mounting machine, 4: host computer, 6: component tape, 8: reel, 22: head moving device, 20: tape feeder, 36: LCR measurement device, 60: control device, 62: controller, 72: memory section, 80: display, 92: memory section

The invention claimed is:

1. A component evaluation method, comprising:
providing a component tape holding a plurality of components held side by side in a longitudinal direction on the component tape;
providing a mounting and placement sequence for the plurality of components, the mounting and placement sequence including mounting information for performing mounting work on a circuit board, and placement information for placing a group of components among the plurality of components on an electrical characteristic measurement device provided in the component mounting machine, the group of components being based on a number of the plurality of components and a variable, and including a component positioned at a leading end of the component tape and a component positioned in a middle of the component tape;
reading a next piece of information in the mounting and placement sequence;
when the next piece of information in the mounting and placement sequence is the mounting information, performing the mounting work of picking up and carrying the component corresponding to the next piece of information in the mounting and placement sequence so as to be mounted on the circuit board by moving a suction nozzle based on the mounting information in the mounting and placement sequence;
when the next piece of information in the mounting and placement sequence is the placement information, moving the component corresponding to the next piece of information in the mounting and placement sequence to the electrical characteristic measurement device and measuring electrical characteristics of the component corresponding to the next piece of information in the mounting and placement sequence using the electrical characteristic measurement device; and
performing statistical processing on measured values of the electrical characteristics of the group of components.

2. The component evaluation method according to claim 1, further comprising evaluating the electrical characteristics of the group of components held on the component tape based on the statistical processing.

3. The component evaluation method according to claim 1, wherein, in the measuring, electrical characteristics of an inputted number of components from a component positioned at the leading end of the component tape are successively measured.

4. An electrical characteristic measurement method for measuring electrical characteristics of components in a component mounting machine during performance of a mounting work in which the components are picked up and carried so as to be mounted on a circuit board, the method comprising:
providing a component tape holding a plurality of components held side by side in a longitudinal direction on the component tape;
providing a mounting and placement sequence for the plurality of components, the mounting and placement sequence including mounting information for performing the mounting work on the circuit board, and placement information for placing a group of components among the plurality of components on an electrical characteristic measurement device provided in the component mounting machine, the group of components being based on a number of the plurality of components and a variable, and including a component positioned at a leading end of the component tape and a component positioned in a middle of the component tape;

reading a next piece of information in the mounting and placement sequence;

when the next piece of information in the mounting and placement sequence is the mounting information, performing the mounting work for the component corresponding to the next piece of information in the mounting and placement sequence by moving a suction nozzle based on the mounting information in the mounting and placement sequence; and when the next piece of information in the mounting and placement sequence is the placement information, moving the component corresponding to the next piece of information in the mounting and placement sequence to the electrical characteristic measurement device and measuring electrical characteristics of the one component of the group of components using the electrical characteristic measurement device.

5. The electrical characteristic measurement method according to claim 4, wherein electrical characteristics for each of multiple components are measured, the components being positioned at every predetermined set number among the plurality of components held side by side in the longitudinal direction on the component tape.

6. The electrical characteristic measurement method according to claim 4, wherein electrical characteristics for each of multiple components are measured, the components being randomly selected from the plurality of components held side by side in the longitudinal direction on the component tape.

7. An electrical characteristic measurement method for measuring electrical characteristics of components in a component mounting machine configured to perform a mounting work in which the components are picked up and carried so as to be mounted on a circuit board, the method comprising:

providing a component tape holding a plurality of components held side by side in a longitudinal direction on the component tape;

providing an electrical characteristic measurement device in the component mounting machine, the electrical characteristic measurement device including a component holding table, a pair of measurement parts, an approaching and separating device that approaches or separates the pair of measurement parts to or from each other, a holding table moving device that moves the component holding table between an initial position and a measurement position, and an electrical characteristic measuring circuit; and measuring electrical characteristics for each component using the electrical characteristic measurement device by moving the component to the component measuring table at the initial position, operating the approaching and separating device so as that the pair of measurement parts approach each other and grasp the component at two sides of the component, operating the holding table moving device to move the component measuring table to the measurement position, flowing a current through the component, and obtaining the electrical characteristics from the electrical characteristic measuring circuit, wherein the electrical characteristics of all of the plurality of components are measured one after another such that no mounting work is performed during the measuring.

* * * * *